United States Patent [19]
Greidinger et al.

[11] Patent Number: 5,856,927
[45] Date of Patent: Jan. 5, 1999

[54] METHOD FOR AUTOMATICALLY ROUTING CIRCUITS OF VERY LARGE SCALE INTEGRATION (VLSI)

[75] Inventors: Jacob Greidinger, Cupertino; Mark R. Hartoog, Los Gatos; Ara Markosian, Sunnyvale; Christine Fawcett, Los Altos Hill; Eugenia Gelfund, San Jose; Prasad Sakhamuri, Campbell, all of Calif.

[73] Assignee: VLSI Technology, Inc., San Jose, Calif.

[21] Appl. No.: 432,236

[22] Filed: May 1, 1995

[51] Int. Cl.$^6$ .............................. G06F 15/00; H01L 27/10
[52] U.S. Cl. .................... 364/491; 364/488; 364/489; 364/490; 251/206; 251/210; 327/565
[58] Field of Search .................................... 364/488, 489, 364/490, 491; 395/500, 800, 13, 921; 371/1; 257/211, 210, 206, 909, 204, 369; 438/598; 327/565, 564

[56] References Cited

U.S. PATENT DOCUMENTS

| | | | |
|---|---|---|---|
| 3,629,843 | 12/1971 | Scheinman | 364/490 |
| 4,580,228 | 4/1986 | Noto | 364/491 |
| 4,593,363 | 6/1986 | Burstein et al. | 364/491 |
| 4,754,408 | 6/1988 | Carpenter et al. | 364/491 |
| 5,144,563 | 9/1992 | Date et al. | 364/491 |
| 5,224,056 | 6/1993 | Chene et al. | 364/490 |
| 5,307,286 | 4/1994 | Rusu et al. | 364/490 |
| 5,309,370 | 5/1994 | Wong | 364/490 |
| 5,349,536 | 9/1994 | Ashtaputre et al. | 364/491 |
| 5,359,538 | 10/1994 | Hui et al. | 364/490 |
| 5,361,214 | 11/1994 | Aoki | 364/490 |
| 5,465,218 | 11/1995 | Handa | 364/488 |
| 5,483,461 | 1/1996 | Lee et al. | 364/490 |
| 5,521,837 | 5/1996 | Frankle et al. | 364/491 |
| 5,550,748 | 8/1996 | Xiong | 364/491 |

*Primary Examiner*—Jacques Louis-Jacques
*Attorney, Agent, or Firm*—Irell & Manella LLP

[57] ABSTRACT

An automated routing tool for routing interconnections between circuit elements, standard cells and/or cell blocks of cell-based designs which incorporates the best features of both currently known gate array routing techniques with currently known cell-based routing techniques. The invention eliminates the disadvantages of permitting the detailed router to adjust the relative positions of the circuit elements, standard cells and/or cell blocks during the detailed routing process. The method employs a topology manager which iteratively compacts the circuit topology while at the same time optimizing the routing of the interconnections among the circuit elements, standard cells and/or cell blocks of the circuit design. The method employs bin-based global routing, which identifies expandable boundaries and which provides input to a compaction routine which expands or contracts the expandable areas in accordance with the result of the global routing process. The detailed routing step is not performed until after the relative positions of the circuit elements, cells and/or cell blocks have been already fixed.

20 Claims, 9 Drawing Sheets

METHOD FOR AUTOMATICALLY ROUTING CIRCUITS OF VERY LARGE SCALE INTEGRATION (VLSI)

BACKGROUND OF THE INVENTION

1. Field of the Invention

The present invention relates to the automated routing of circuit nets of integrated circuits, and more particularly to the automated routing of circuit nets for VLSI circuits having cell-based topologies.

2. Background of the Related Art

With the advent of circuit feature sizes in the sub-micron range, integrated circuits involving millions of transistors on a single chip have become commonplace. Due to the sheer number of devices on a single chip, an entire industry has evolved specifically to supply the semiconductor industry with software and hardware tools to automate much of the process of integrated circuit design.

There are two primary approaches to developing integrated circuits having Very Large Scale Integration (VLSI). One approach is the use of gate arrays. Gate arrays are integrated circuits having a fixed number of identical sites, each site comprising a number of simple circuit elements. The circuit elements are configured in a manner which enables easy implementation of common logic circuits such as transfer gates, inverters, nand gates, etc., depending upon how they are connected. A gate array can then be used to implement a specific circuit design simply by specifying the interconnection between the otherwise standard circuit elements. The particular interconnections of the circuit elements that are necessary to achieve a design are typically expressed as a netlist. The netlist defining the interconnections among the circuit elements of the gate array is often generated by other design synthesis tools.

A typical gate array floor plan called a base, is shown in FIG. 1A. The topology of a gate array base is predefined by the gate array manufacturer. The circuit elements are arranged in rows 10 with a predetermined distance 12 between the rows as shown. Another gate array topology configures the circuit elements 20 in an array format as shown in FIG. 1C, also known as a "sea of gates."

A second approach to the design of VLSI integrated circuits is the use of standard cells. Like gate arrays, standard cell designs rely on a set of predefined circuit elements called cells with which to implement the design. Unlike gate arrays, however, the complexity of standard cells can range from simple logic gates such as those found in gate arrays to block-level components such as RAMs, ROMs, and PLAs. The standard cells are typically stored in a standard cell library, and are retrieved from the library as specified by the netlist of the design. The block-level components can be built from the lower level cells of the library and can also be stored in the library for duplication as required by a netlist. Further, standard cell designs are not topologically fixed. Rather, standard cells can be placed anywhere on the integrated circuit being designed. A typical standard cell (i.e. cell-based) floor plan is shown in FIG. 1B.

The primary advantage of gate array designs is that the manufacturer can mass produce a large quantity of identical circuit bases which are typically completed up to the stage of the process where interconnections are made. A circuit designer can then provide a netlist to the manufacturer which defines all of the interconnections among the available circuit elements on a particular base. The manufacturer can use the netlist to create the masks necessary to produce the interconnections for the completed circuit, and complete the manufacturing process accordingly. Thus, non-recoverable engineering (NRE) costs are relatively low and design turnaround time relatively short.

One of the downsides of the fixed topology of a gate array is that for a given design there are a limited number of circuit elements that can be interconnected to produce the design. Thus, if a VLSI circuit design as specified by a particular netlist requires more circuit elements than are provided on a particular gate array, or if there is insufficient room available to complete the interconnections among the available circuit elements, one must move to the next larger gate array base in order to implement the design, even if this means wasting silicon area.

The primary advantage of cell-based designs is that greater circuit densities can be achieved. This is because the size of the circuit is typically determined during the routing process and need only be large enough to accommodate the final placement and interconnection of the cells. Another advantage is greater functionality due to the hierarchial nature of cell-based designs.

The cell-based topology shown in FIG. 1B has random logic, typically comprised of low level cells, arranged as rows 14 much like the rows of gate array circuit elements in FIG. 1A. The topology also includes complex functional blocks 16, which can be designed from scratch or can be conglomerations of lower-level cells. The complex functional blocks are represented in the netlist in the same manner as the lower-level cells. That is, they are specified as a function of their interconnections among the other blocks and cells. Channels 18 are initially defined for purposes of routing interconnections among the rows of cells 14 and the high-level functional blocks 16. A pure hierarchial approach might further integrate random logic rows 14 into one or more higher-level blocks.

A number of algorithms have been developed and implemented to facilitate the automatic routing of interconnections among the circuit elements of both gate array and cell-based circuit designs. Such algorithms are integrated into software tools called routers, which take as part of their input a netlist description of the desired circuit design. These tools attempt to automatically route the interconnections among the circuit elements of the gate array, or the standard cells and functional blocks of cell-based designs, as specified by the netlist.

Routing algorithms as incorporated into tools for routing gate arrays are considerably different from those algorithms employed in tools for routing cell-based designs. This is due primarily to the fact that gate array topologies are fixed while cell-based topologies are not. Further, cell-based designs have been heretofore based primarily on the routing of channels between rows and blocks, while "sea of gates" gate array topologies have no predefined channels between circuit elements. Finally, because cell-based designs are typically hierarchial in nature, the routing of cell-based designs are also typically hierarchial in nature. Interconnections within complex functional blocks of cell-based designs can be routed first and optimized such that the final routing of the cell-based design involves only routing connections among the various functional blocks.

Often, tools for routing interconnections among the cell-based designs employ routers which are designed for a particular type of functional block. For example, certain routers are designed specifically to handle common structures such as RAMs and ROMs. Once these high level blocks are routed and optimized using these specialized routers, the routing of the interconnections among the functional blocks of the cell-based design becomes less complex.

As applied to gate arrays, channel routers are not permitted to adjust (d) 20 between the rows, although they can add pass-through connections 27 to permit interconnections to pass through the rows as illustrated by interconnect line 25 of FIG. 2A.

Most routing tools currently available for automatically routing cell-based designs are based on "channel" router algorithms. Versions of channel router algorithms are also used for gate array topologies that are row-based. The channel router evolved at a time when both gate arrays and cell-based designs were arranged in rows as shown in FIG. 2A. The classical channel router attempts to route the interconnections in the channels 26 between the rows of cells 22. Because the location of the circuit elements comprising the standard cells of a cell-based design are not already fixed, the channel router has the freedom to adjust the distance (d) 20 between the rows of cells 22 as well as the width (w) 24 of the cells to accommodate the routing of the interconnections as specified by the netlist for the design. Thus, the circuit as finally routed might look something like that which is shown in FIG. 2B. The width of the cells (W) 26 have been increased to accommodate pass through connections 30 and the distance between rows (D) 28 have been expanded to accommodate the number of interconnections that must run between the rows of cells 22. FIGS. 3A and 3B illustrate the expansion of channels by a channel router as applied to a block-level cell-based design.

FIG. 4 shows an exploded view of a row-based topology. Each circuit cell 44 has input and/or output connectors 40 by which the cells 44 are interconnected with one another. The netlist defines the various circuit nets as connections between input and output connectors of components or cells comprising the circuit. As applied to cell-based designs, the channel router is designed to minimize the width (w) of the channel 48 while accommodating all of the interconnections between the rows of cells 42 which define the channel 48. As applied to row-oriented gate arrays, the channel router attempts to route all of the nets using the predefined width of the channel 48.

A number of assumptions were made in the development of channel router algorithms. Among these assumptions are that the channel 48 is always rectangular in nature, that there are no obstructions to routing interconnections through the channel 48, all of the connectors 40 emanating from the various cells 44 are contained within the boundaries of the channel 48. Additionally, any of the connections which extend beyond the length of the channel (e.g. connection 46) are floating and can be located anywhere within the width of the channel. Stated differently, there is no predefined order with respect to the position of a particular connection within the channel. Still further, most channel routers were designed for use with two levels of interconnect. One was typically assigned to vertically extending portions 41 of the connections 46 and the other to the horizontally extending portions 43 of the connections 46 running parallel with the channel. Of course, the channel router will also be constrained by the ground rules of the particular process being used to fabricate the integrated circuit, including the minimum width of the connections 46, as well as the minimum distance between the various connections 46.

Over the years, many extensions of the classic channel router have been made, including the permissibility of specifying connectors 40 inside cells 44 as opposed to only at their border with the channel, the ability to have cells 44 which do not necessarily have the same widths or heights, as well as more than two layers of interconnect. Unfortunately, none of these "improvements" were able to improve the performance of the channel router much beyond the classic case as shown in FIG. 4.

Another well-known routing algorithm is known as a maze router. The algorithm employed is also known as wave propagation. The maze router overlays a grid 56 on the topology of cells or circuit elements, with each intersection of the grid 58 representing either connectors or spaces through which interconnect can be run. The maze router identifies a source connector 50 and a target connector 52 to which the source connector must be connected, in accordance with the netlist of the circuit design. The maze router then explores every possible route available to connect the source connector 50 to the target connector 52. Certain of the interconnect routes will already be blocked either by the presence of other connectors or circuit elements. This is represented by locations 54. The maze router assigns a cost to each neighboring point, the cost being associated with the physical realities of committing a particular net to run through that point. Although this particular algorithm will always find a path from source to target if one exists, because it evaluates every possible avenue of connection, it is extremely slow and extremely memory intensive. Of course, numerous attempts have been made to optimize the maze router for speed and memory capacity. Despite these attempts, however, the maze router continues to be cumbersome.

Probe routers, like maze routers, attempt to find a path from source to target. FIG. 6 illustrates an example of a line probe router determining a path between a source 60 and a target 66. The line probe router starts at the source and attempts to generate two lines, one in the X direction one in the Y direction. It then attempts to determine the longest line that it can run while still moving towards the target before it hits an obstruction 62. At the end of the line 64 the probe router then expands two more lines in the X and Y directions and again determines the longest line it can run while still moving in the general direction of the target 66. Eventually the line probe router finds the series of vertical and horizontal lines which will connect the source to the target. The line probe router is much faster than the maze router. Unlike the maze router, the line probe router does not promise to find a solution even if one does exist, nor does it promise to find the cheapest solution. There have also been attempts to produce hybrids of maze and line probe routers, to exploit the best features of both routers.

Maze and line probe routers are typically applied to special cases where only one layer of metal is available for interconnecting devices. Such routers are not readily applicable to general purpose situations.

Another type of routing algorithm is illustrated in FIG. 9 which is also grid oriented. Called bin-based routing, each line 98 on the two-dimensional grid 90 is called a bin boundary and each rectangular area 92 is called a bin. Each bin boundary has a certain capacity for interconnect lines crossing it. The capacity of each bin boundary 98 is determined by constraints imposed by the fixed gate array topology. Circuit structures 96 can limit a bin boundary's capacity, as well as the design rules for the process. The grid can be made coarse or fine, depending upon the level of detail at which the router is operating. This type of routing is most applied to "sea of gates" gate array topologies.

Most currently available design tools are hierarchial in nature, and often employ more than one type of routing algorithm. Most routing tools used for cell-based designs begin with the placement of circuit elements, cells and/or cell blocks. Placement can be manual or automated, and typically attempts to make intelligent decisions about where connectors to the circuit elements, cells and/or cell blocks should be located as well as how cells and/or blocks should be oriented and positioned relative to one another. Such decisions can be driven by considerations of circuit compaction, number of interconnect lines running between the blocks, etc. Of course, with gate arrays there is no placement step because this process has already been forced on the designer by the manufacturer.

The next step is typically a global routing step, which is an attempt to logically determine what general paths each interconnection is going to take to accomplish its designated connections. These decisions are made based on the available avenues formed by the current placement of circuit elements and/or blocks, and are assigned in consideration of various costs (i.e. such as to incur the shortest amount of interconnect between the connectors).

Gate array global routers employing bin-based routing will attempt to assign to each bin boundary those connectors which are to cross a given bin boundary, although typically not the order in which they cross. As previously mentioned, most cell-based routing tools employ channel-based routing so their global routers are typically assigning various interconnect lines to the available channels. Again, the cell-based global routers do not assign the ordering of the interconnect lines running through the channels.

Once the global router has assigned the general flow of interconnect lines, a detailed router takes over and actually attempts to make the interconnect lines fit the assignments made by the global router. In the case of the gate array design, the detailed router knows it can make the routing because the global router was assigning lines to bin boundaries based on fixed capacities. Because most routing tools applied to cell-based designs employ channel routers as their detailed routers, however, the circuit elements or blocks along the channels are subject to being moved by the channel router.

As previously mentioned, most cell-based circuit designs are block-level or hierarchial in nature. A block-level standard cell design topology is illustrated in FIG. 7a. In most block-level designs, however, some of the blocks (e.g. block 79) are actually made up of classical standard cell random logic which is typically oriented into rows of cells. Present solutions to routing such circuit designs are typically packages made up of several different routers which are then applied in a hierarchial manner using the foregoing flow.

At the lowest levels, specialized routers are used to route specific types of cell blocks. Thus, routers which are optimally tailored for routing particular types of structures are used on memory blocks, ALU's and other high-level functional blocks. Channel routers are typically applied to route classic standard cell-based random logic. Once each of the higher level blocks has been routed, a new netlist is generated which simply represents the interconnections among the higher level blocks. Information detailing the physical locations of the connectors for the various blocks is also compiled. This information can then be used either manually or perhaps with some automated placement algorithm to arrange the blocks in accordance with criteria such as the number of lines running between certain of the blocks, the proximity and orientation of connectors of particular blocks, as well as the geometries of the blocks to minimize die area.

The use of channel routers as detailed routers on cell-based designs such as that shown in FIG. 7a imposes undesirable limitations on the circuit topology because of its ability to move circuit elements, cells and/or cell blocks right up until a given channel is completely routed. Using channel routers as detailed routers requires that the cells and/or blocks be arranged in a sliceable design configuration.

FIG. 7a shows slicing line 78 drawn through the arrangement of cell blocks for a proposed cell based circuit design. A sliceable design requires that slice line 78 be able to completely split the channels between the various cell blocks 72, 77 and 79. Each of the slice lines is given a unique slice line number with those slice lines splitting channels co-extensive with multiple blocks being assigned the lowest numbers and those slice lines which split channels co-extensive with single blocks given the highest numbers. The detailed router will then route each channel split by a slice line beginning with the slice line having the highest assigned number and proceeding in order down to the channel split by the slice line having the lowest assigned number.

The use of channel routers requires that this ordering be imposed on the channel router because the channel router is permitted to adjust the size of a channel based on the number of lines which must be run through that channel. Thus when the channel split by slice line 5 is routed, blocks 71 and 73 may be shifted by the channel router relative to one another as the channel router attempts to route all of the interconnect lines assigned to the channel by the global router through that channel. Until that channel has been completely routed, the positions of block 73 and 71 relative to one another are subject to change at any time. Thus the physical positions of the connectors of blocks 73 and 71, which are associated with the edges of those blocks co-extensive with the channel split by slice line 2 will not be fixed until the channel split by slice line 5 has been completely routed.

Furthermore, floating nodes 74, which are the positions of interconnect lines 70 as they emerge from the channels split by slice lines 4 and 3 and intersect with other channels, will not be fixed until the channels split by slice lines 4 and 3 have been completely routed. From the point of view of the channels split by slice line 2, these floating nodes look just like connectors emerging from edges of blocks co-extensive with that channel. Thus, it would be futile for the channel router to route the channels split by slice line 2 before the channels split by slice lines 4 and 5 have been routed. Of course, there is some flexibility with respect to this ordering as the channel split by slice line 4 could be routed before the channel split by slice line 5.

Boundary channels 76 will be the last boundaries to be routed by the channel router because all of the cell blocks will have been fixed in position relative to the boundaries of the chip and thus only the boundaries need be expanded to accommodate the interconnections that are to be routed through those boundary channels. Because the cell-based design must be sliceable, routing tools based on channel routers as detailed routers cannot route the non-sliceable design of FIG. 7B, even though it may be more compact that way.

As previously discussed, prior to applying the detailed router (i.e. channel router) to the various channels in accordance with the routing order as determined by the slicing of the topology, a global router is used to determine which of the interconnections as represented by the netlist of the circuit design should be routed through which of the channels between the cell blocks. Thus, it is the global router's job to optimize the assignment of the various interconnections described by the netlist to the various channels defined by the topology. In the example shown in FIG. 7a, the global router determined that interconnect line 70 would travel through the channel split by slicing line 4, then through the channel split by slicing line 2, and finally through the channel split by slicing line 3 to its connection to block 72. It also determined that the continuing connection would continue through the channel split by slicing line 2 and then through the vertical boundary channel coextensive with the right vertical edge of the block 72.

Once the global assignments have been made it becomes the job of the channel router to figure out how to route all of the lines through each channel as assigned by the global router. The channel router will typically estimate the space required by the channel for the number of lines that have been assigned to that channel by the global router. It then tries to figure out how to accomplish the routing using the estimated width of the channel. If it is unsuccessful in routing the channel using the estimated width, it simply expands the width by moving the location of the cell blocks relative to one another to increase the width of the channel. The channel router continues with this process until it is able to complete the routing of the channel. As previously mentioned, the global router does not determine the position of each line within the channel to which it has assigned the line. The placement of each line within the channel is completely left up to the channel router.

There are a number of limitations and disadvantages to cell-based routing tools employing channel routers as detailed routers in addition to the restrictions to sliceable topologies as just described. Nonrectangular shaped blocks are typically not permitted because channel routers are not designed to route channels formed by nonrectangular shapes, and because such geometries typically render the design nonsliceable. Further, the use of channel routers as a detailed router means that cell-block locations will be altered after the global routing process has been completed. Thus, decisions made by the global router as to which interconnect lines should optimally run through which of the channels, made based on then current cell block positions, cell and/or block connector locations, etc. can be rendered obsolete and therefore nonoptimal by the channel router as it moves the blocks to complete the routing of each channel.

FIG. 8 illustrates an example of when a decision made by a global router has been rendered obsolete by the channel router. Prior to the detailed routing step, the global router recognizes that connection 86 is most optimally routed through channel 80 between blocks 84 and 80. The next stage of FIG. 8, after detailed routing has occurred, illustrates what can happen to that formally optimal channel assignment if the channel router has shifted the blocks 84 and 82 during the process of routing all of the channels. Connection 86 is still made through channel 80 between blocks 84 and 82, but because the blocks have been shifted to the left by the channel routing process, what was formally an optimal channel assignment has become nonoptimal. This problem can become even more acute for large buses of 64 or even 128 lines. Even a very slight shift creates a huge problem when it comes to such large buses.

This type of problem can also occur when the routing tool is routing individual functional blocks or random logic blocks. Decisions about where it is best to locate connectors within the cell or block, pass-through lanes in the blocks for external lines, etc. can be rendered obsolete as the blocks themselves come out looking differently than originally planned.

Another disadvantage to the foregoing cell-based routing methodology is that channel based routers typically are not designed to handle the routing of circuits being fabricated in a process which has more than two levels of interconnect available. If some of the cell blocks of FIG. 7a have been internally routed with only two levels of interconnect, and the process used to fabricate the circuit has three or more levels available to it, levels of interconnect not used internally in those blocks could be run directly over the top of those blocks. Because of the way global routers and detailed routers are set up when the detailed router is a channel router, it is awkward to fool those routers into incorporating areas of those blocks into channels. Further, the decisions as to which portions of which blocks to assign to which channels must be made prior to the actual channel routing process. Again, because the channel router is able to move the locations of cell blocks as it completes its task of routing each channel, those decisions as to the allocation of routable block area to various channels can be obsoleted in the same way that decisions made by the global router as to which channels through which to run interconnect lines can become obsoleted by the channel routing process.

A still further constraint imposed on the efficient and optimal routing of cell-based designs by channel-based routing tools is the inability to handle prerouting of certain interconnect lines ahead of time, or to impose constraints on relative positionings of blocks, or on minimum or maximum allowable distances between blocks, interconnections or connectors.

Therefore, there is significant room for improvement in the art of automatically routing interconnections among cell-based circuit design topologies.

Because the topologies of gate arrays are fixed for the most part, even those which use modified versions of channel routers don't suffer from the problems discussed above with respect to cell-based routing tools. Global routers of gate array routing tools have fixed resources with which to work and either they can or can't accomplish the routing of all of the nets of the netlist given those resources. Of course routers for gate arrays are also less complex because they are free of the complexities engendered by having the freedom of moving (i.e. expanding or contracting) the resources.

The global router typically used to route a gate array topology such as the one shown in FIG. 2A basically makes the decision at what point 27 the interconnect lines must cross rows in order that connector 21 be interconnected with connector 23. Sometimes the global router will also drive a specialized algorithm which has the ability to add pass-through cells to the cells of the rows in order to accommodate or to create additional cross over points 27 by which interconnect lines are permitted to cross cells in the rows 22.

To route the gate array topology of FIG. 1C (i.e. "sea of gates"), a coarse grid 90 is typically superimposed by the global router over the top of the topology as shown in FIG. 9. The positioning of the grid 90 over the "sea of gates" topology by the global router can be, but is not necessarily, aligned with the rows and columns of circuit elements or cells. Thus the grid will have within each grid cell 92 various connectors 94 and various circuit elements or cells 96. The global router determines upfront which grid cell boundaries 98 will be crossed by which interconnect lines. Of course, the global router makes this decision in an attempt to route all of the nets or interconnections specified by the netlist of the circuit design while remaining within the given capacity of each of the bin boundaries.

Those of skill in the art have recognized the disadvantages of channel-based routing of cell-based designs, and that adapting gate array type routing schemes for use in the cell-based context is desirable. Cadence Design Systems has introduced a product called CELL 3, which has manual user interface. Permits a user to manually move cell and block placement around and try to route. If the router cannot, manually move the placement and try again. This is highly undesirable because it is not truly automated, nor is it likely to be optimal.

SUMMARY OF THE INVENTION

The present invention is a method for automatically routing the interconnections of a cell-based circuit design which eliminates the disadvantages of using channel-based routers while maintaining the advantages of using cell-based circuit topologies. The present invention applies bin-based routing algorithms such as those used most typically in "sea of gates" gate array topologies to perform the global routing step. Thus, the global router dynamically generates a coarse grid which is overlaid over the top of the cell-based circuit topology placement. The coarse grid is generated so as to maximize the number of bin boundaries running through channel spaces between circuit elements, cells and/or cell blocks.

The present invention identifies those bin boundaries which are co-extensive with channel spaces as being expandable, and identifies those sets of bin boundaries which must expand or contract together as expandable areas. Those bin boundaries which overlay circuit elements, cells and/or cell blocks which cannot be moved are identified as non-expandable areas.

The present invention then determines the minimum capacity for all expandable areas, the minimum capacity being that capacity at which the expandable area can be contracted no further. Minimum capacity is typically due to process ground rules.

The global router then logically assigns all nets through the expandable and non-expandable boundaries while attempting to minimize the cost of routing those nets. Minimizing cost includes moving any overflow of capacity on non-expandable boundaries and non-expandable areas to expandable boundaries and expandable areas.

Once all of the nets have been logically routed, if no overflows in capacity exist on any of the expandable boundaries or areas, the present invention then begins an attempt to reduce the number of interconnect lines crossing each expandable area or expandable boundary by removing each interconnect line one-at-a-time crossing the expandable area and attempting to re-route the nets so as not to create any overflows on any expandable or non-expandable areas or boundaries. If removing a particular interconnect line from an expandable boundary or expandable area does not lead to a successful re-route, there is no way to re-route the nets without creating overflows in capacity, the interconnect line is re-inserted and the next one is removed, and so forth. Once an expandable boundary or area has been reduced to its minimum capacity, or the global router has attempted to remove and re-route each of the tracks in the expandable boundary or area, the global router moves on to the next expandable area or boundary.

If after logically routing all nets through the expandable and non-expandable boundaries while optimizing for cost, overflows in capacity remain on any expandable areas, the global router adds a sufficient number of tracks to those expandable areas with overflows to eliminate the overflows. Once this step has been completed, the global router proceeds in its attempt to reduce the number of tracks in each expandable area as described above. This step is also known as rip up and re-route.

Once the global router has logically routed all nets and has attempted to minimize wherever possible the number of interconnect lines running through each expandable area or boundary, the global router provides to a moving or one-dimensional compaction routine the minimum number of tracks (i.e. the minimum capacity) necessary to meet the assignments of each expandable boundary.

The moving routine then attempts to compact the blocks wherever possible and only expands the spaces between blocks where necessary to meet the capacity of those expandable areas as specified by the global router. The moving process is also constrained by the ground rules of the process in which the design is being implemented, as well as the minimum capacities defined by the global router for each of the expandable areas.

If the movement of the blocks created by the moving routine is greater than some pre-determined minimum, the method of the invention goes back and globally routes all of the nets again based on the new locations of the blocks. The method of the invention repeats this iterative process until the amount of movement created by the moving routine is less than the pre-determined minimum.

The invention then performs one final global routing of all nets using no expandable boundaries. At this point, the global routing is much the same as that used in the iterative stage of global routing, except the global router is no longer provided an option to expand or contract boundaries. This final global routing step provides a sanity check to ensure that all of the global routers' decisions are intelligent ones and have not been obsoleted by the movement of the circuit components, cells and/or cell blocks.

The present invention then uses a detailed router to perform the final routing of the nets as previously assigned by the global router. Finally, an output representative of the routed circuit design is generated for purposes of creating masks for the production of the circuit design.

The present invention eliminates the disadvantages of current cell-based routing tools by fixing the location of all circuit elements, standard cells and/or cell blocks prior to the detailed routing stage. The present invention uses the global routing process as the means by which the positioning of the circuit elements, standard cells and/or cell blocks are re-positioned to accommodate the routing of nets for the circuit. Thus, by the time the detailed router is ready to begin the routing of the nets as assigned by the global router, the relative positions of all of the circuit elements, standard cells and/or cell blocks of the cell-based design have been fixed much like in the gate array scenario. The major difference is that the circuit designer was able to take advantage of the flexibility that cell-based designs provide to optimize the layout and routing of the circuit. Just as in the gate array scenario, the detailed router need only worry about how to specifically order the interconnect lines through the bin boundary areas to achieve the desired routing. Unlike the gate array design, however, the capacity of those bin boundary areas as well as the overall size of the circuit has been optimized and fixed by the global routing process.

In an alternate embodiment, the present invention permits users to set constraints on block and cell movement such that edges of blocks may be aligned, connectors on blocks can be aligned, minimum or maximum spacings between blocks or between interconnections can be maintained, and relative positions of blocks can be maintained.

In another embodiment of the invention, the present invention permits a user to input any interconnections that the user wishes to be routed in a particular manner such that the global router will incorporate those preroutes as part of the fixed constraints on block and cell movement made by the moving routine.

DETAILED DESCRIPTION OF THE INVENTION

Figure 1A:
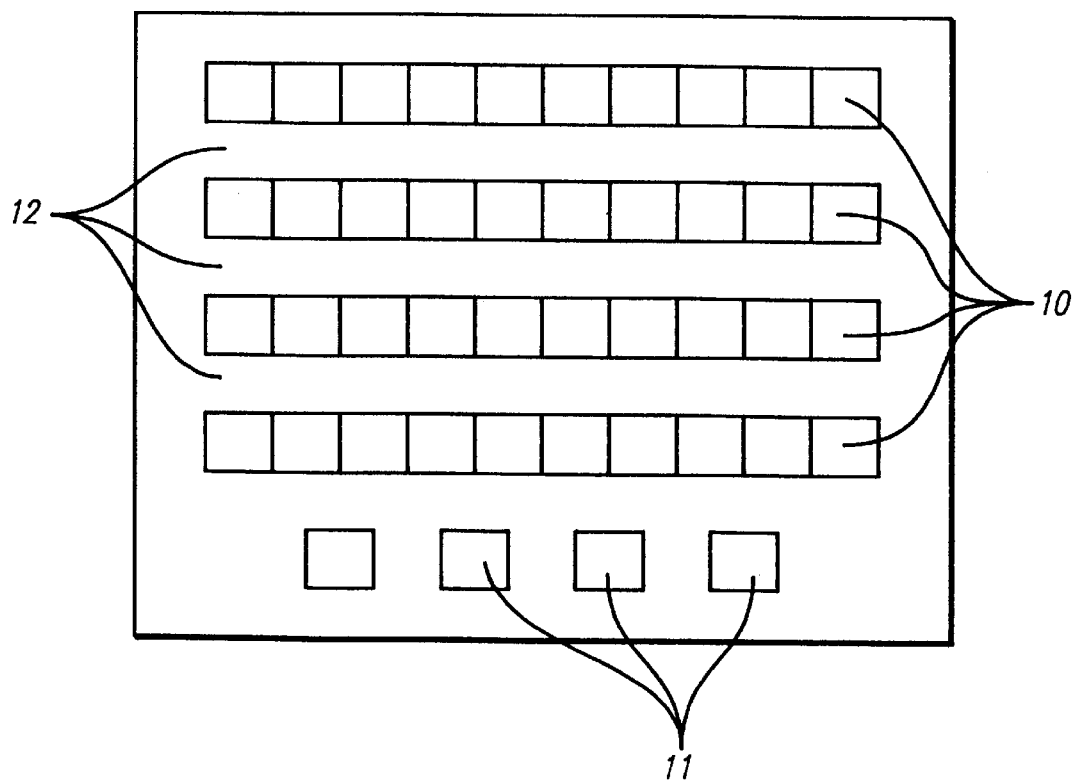
FIG. 1A shows a classic row-based gate array or standard cell topology.
Figure 1B:
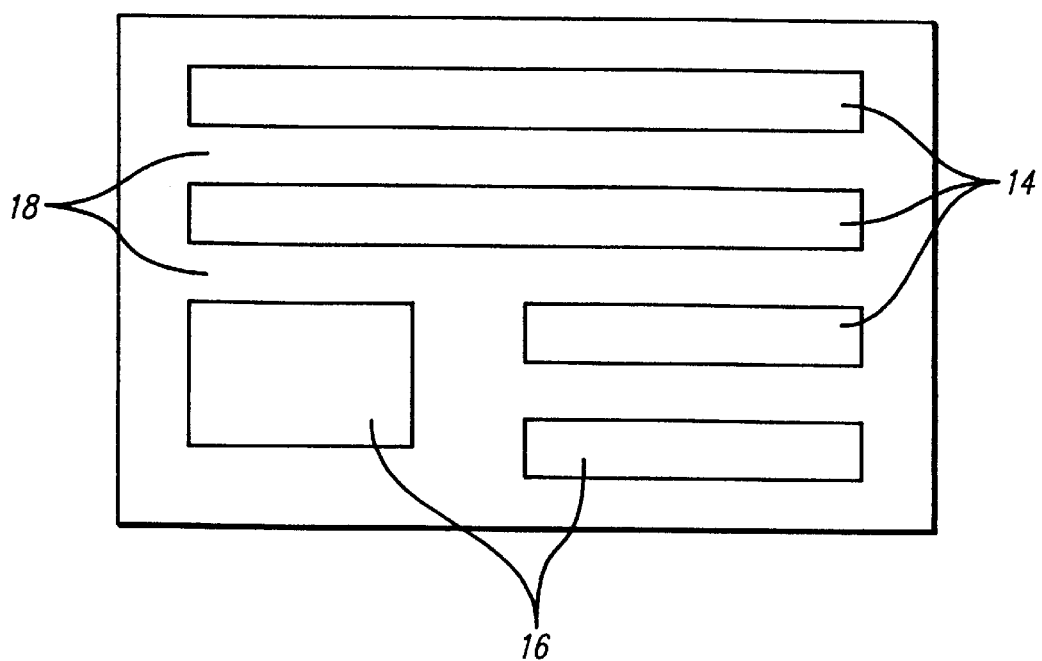
FIG. 1B shows a hierarchial cell-based topology.
Figure 1C:
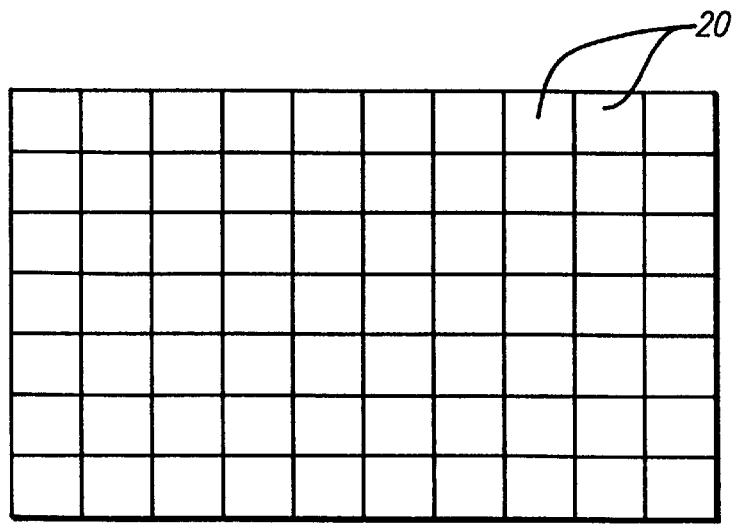
FIG. 1C shows a "sea of gates" gate array topology.
Figure 2A:
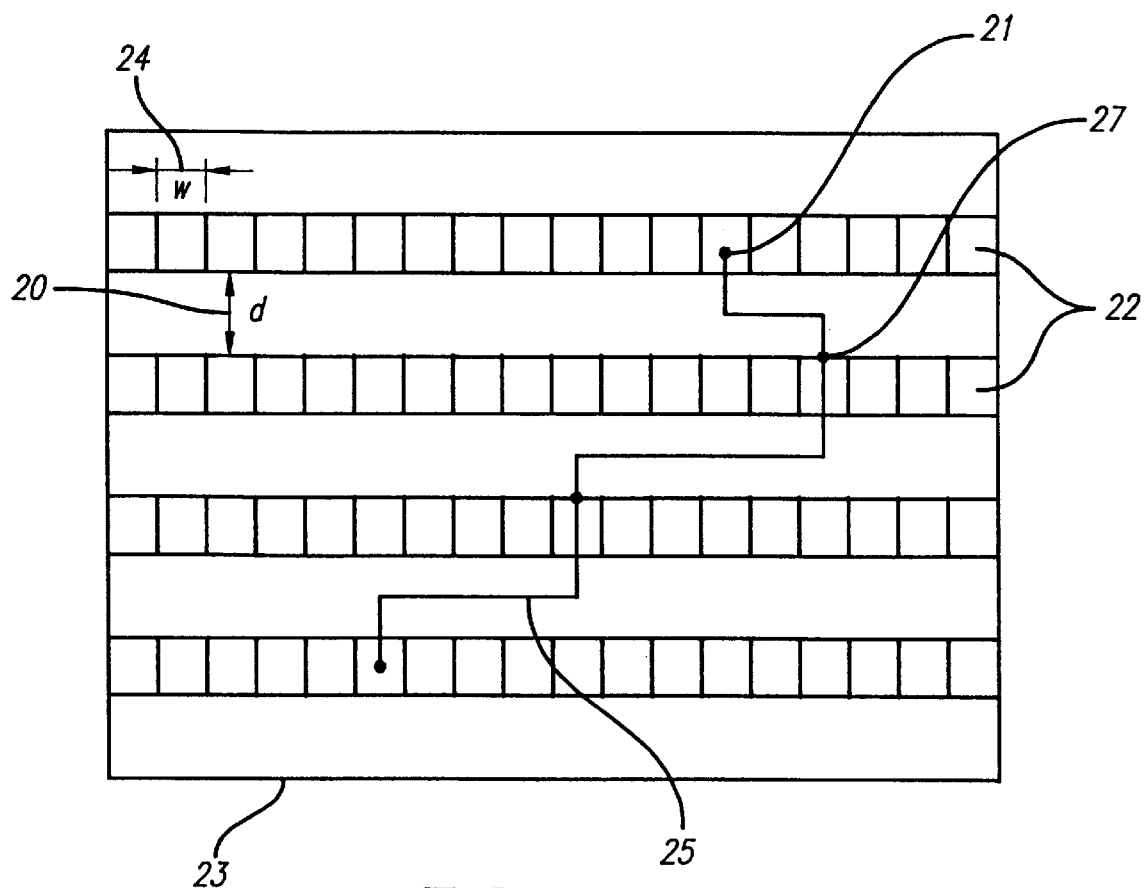
FIG. 2A shows a classic row-based gate array topology after routing or a classic row-based standard cell topology prior to routing.
Figure 2B:
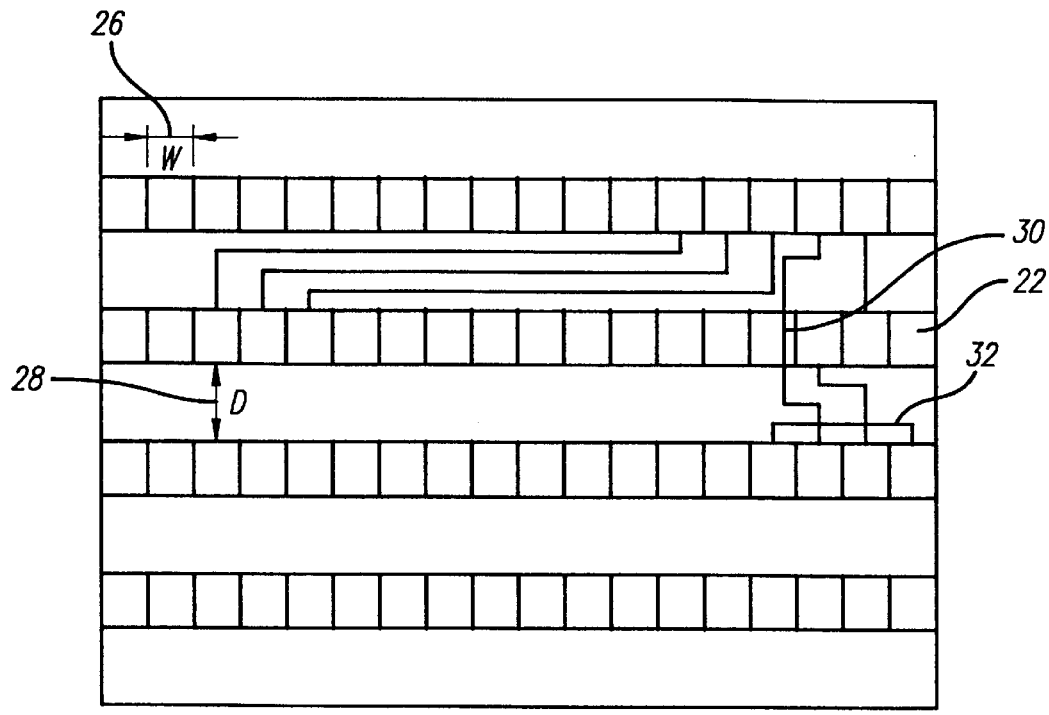
FIG. 2B shows the classic row-based standard cell topology of FIG. 2A after it has been routed by a classical channel router.
Figure 3A:
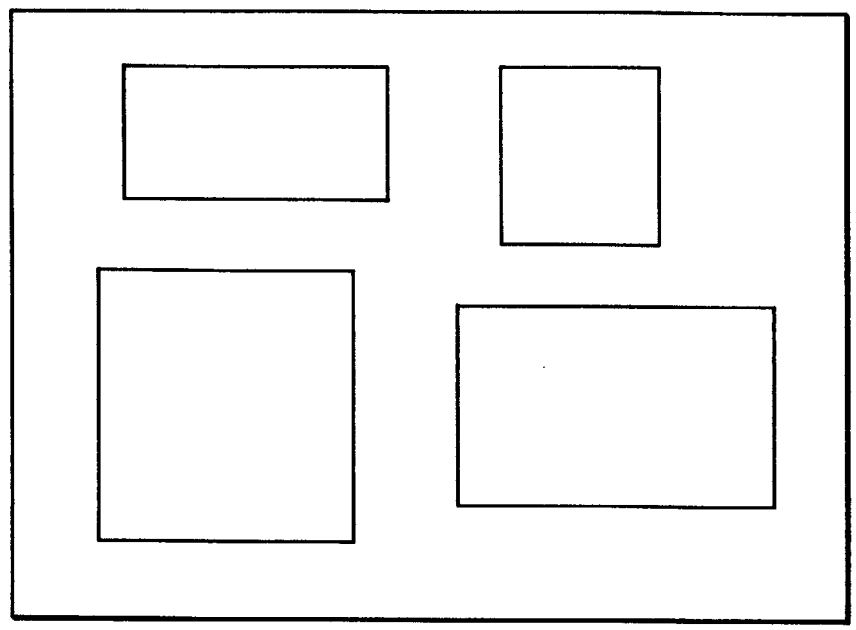
FIG. 3A shows a hierarchial cell-based topology after placement and prior to routing.
Figure 3B:
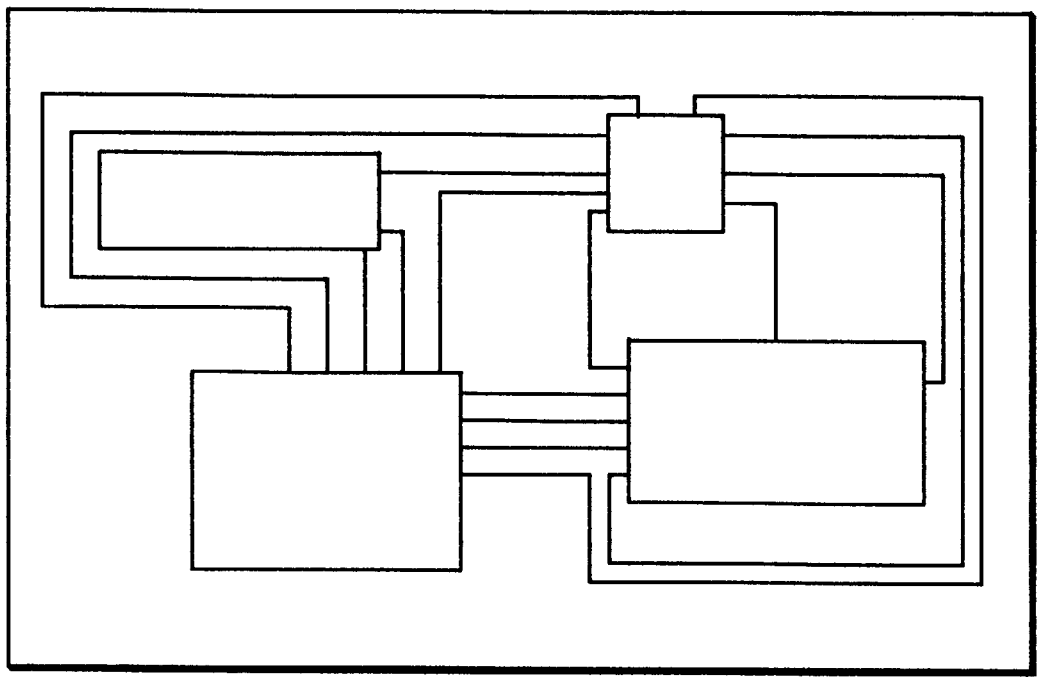
FIG. 3B shows the hierarchial cell-based topology of FIG. 3A after routing by a channel-based router.
Figure 4:
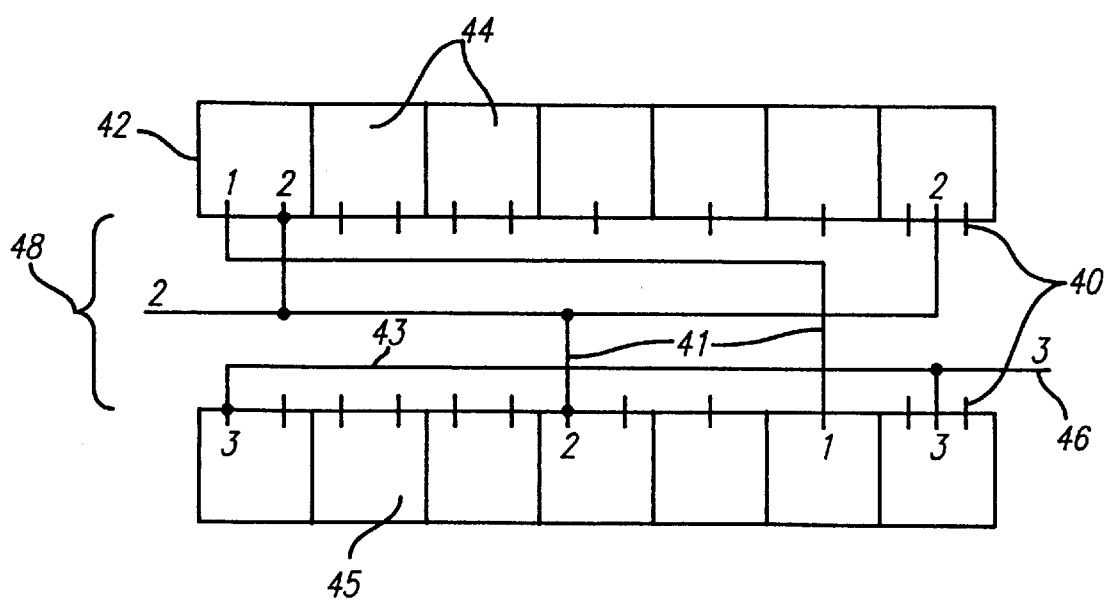
FIG. 4 shows an exploded view of a classic row-based topology routed by a classical channel router.
Figure 5:
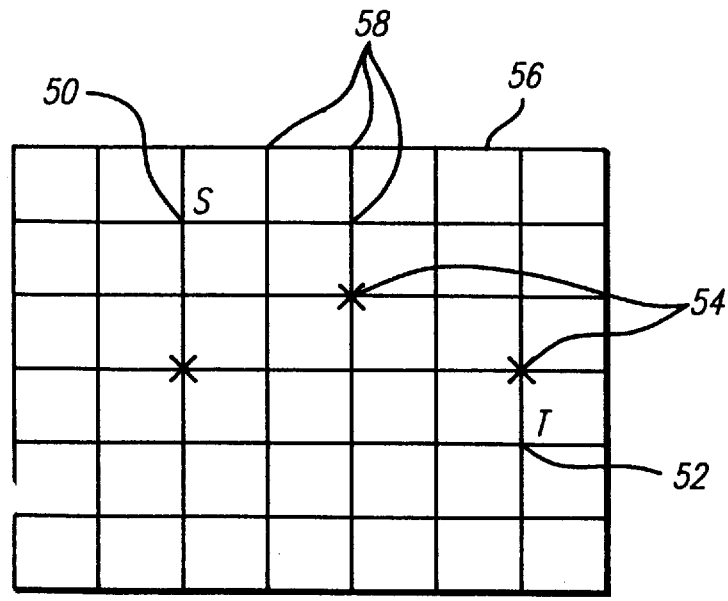
FIG. 5 shows an example of the operation of a maze router.
Figure 6:
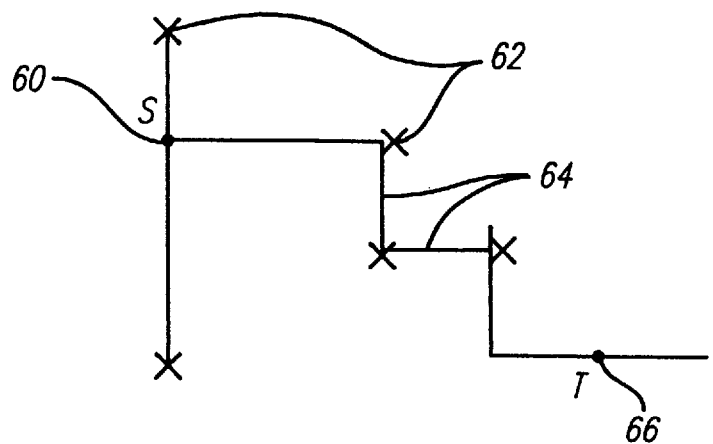
FIG. 6 shows an example of the operation of a line probe router.
Figure 7A:
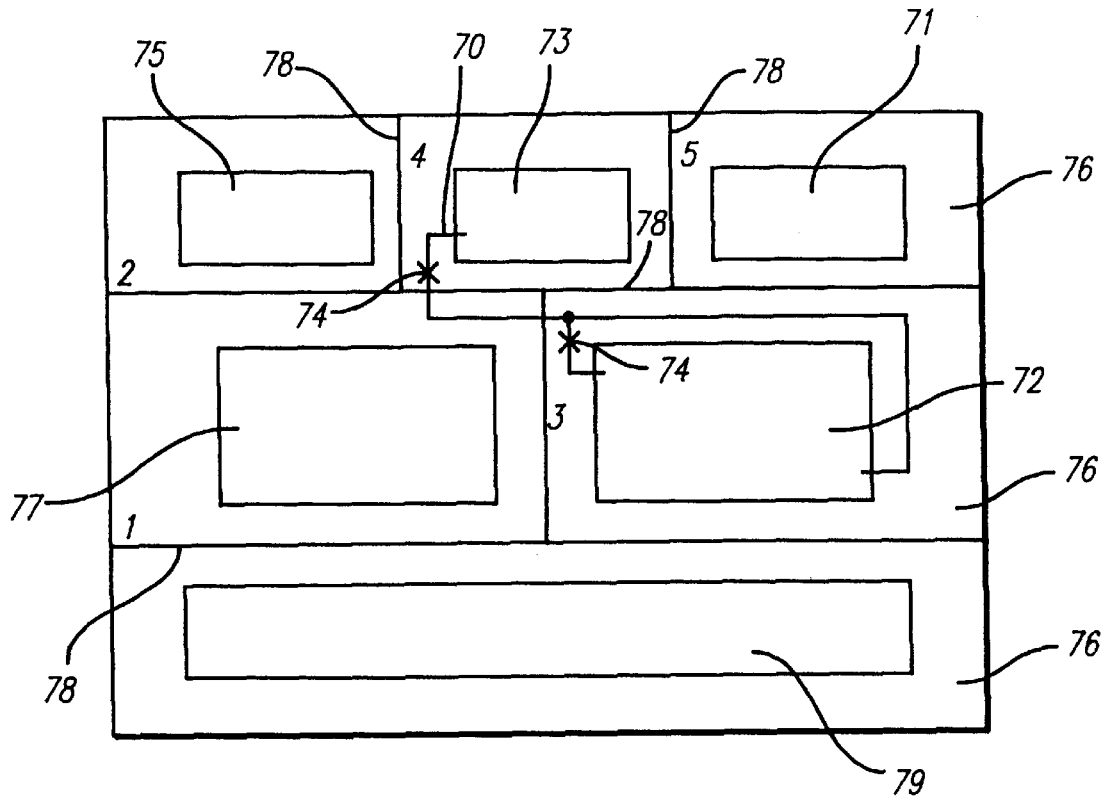
FIG. 7A shows a sliceable cell-based topology along with the slice lines.
Figure 7B:
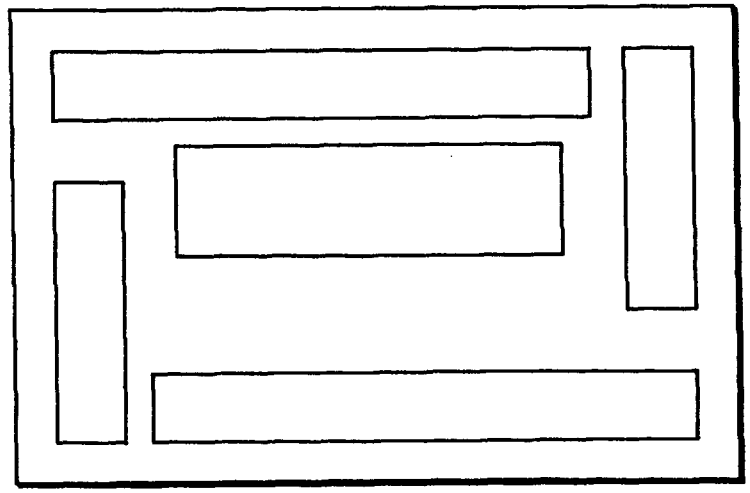
FIG. 7B shows a non-sliceable cell-based topology.
Figure 8:
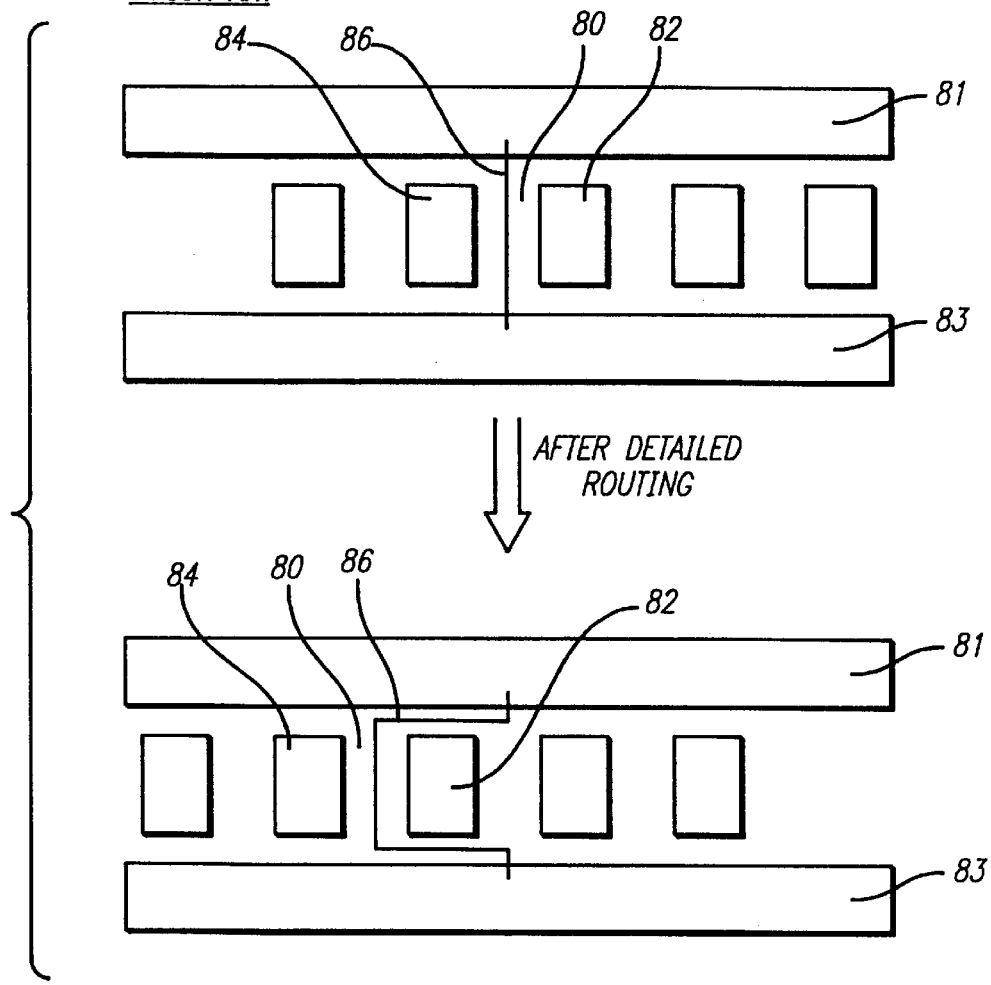
FIG. 8 shows an illustration of an intelligent decision made by a global router and the obsolescence of that decision by detailed routing using a channel-based detailed router in a cell-based design.
Figure 9:
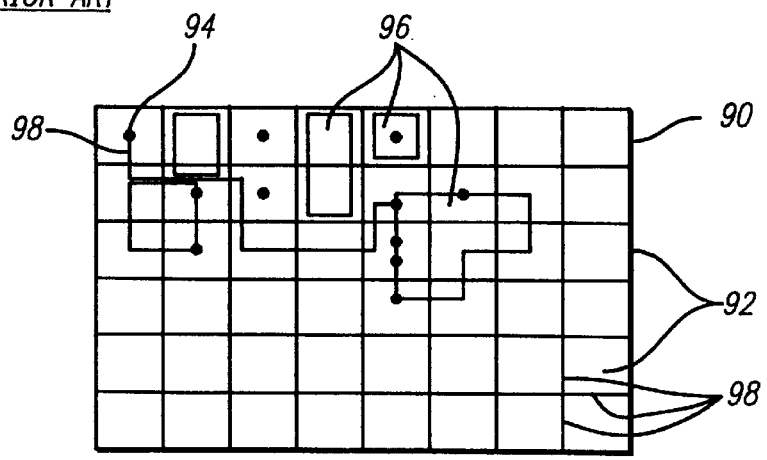
FIG. 9 shows an example of bin-based routing a gate array having a "sea of gates" topology.
Figure 10:
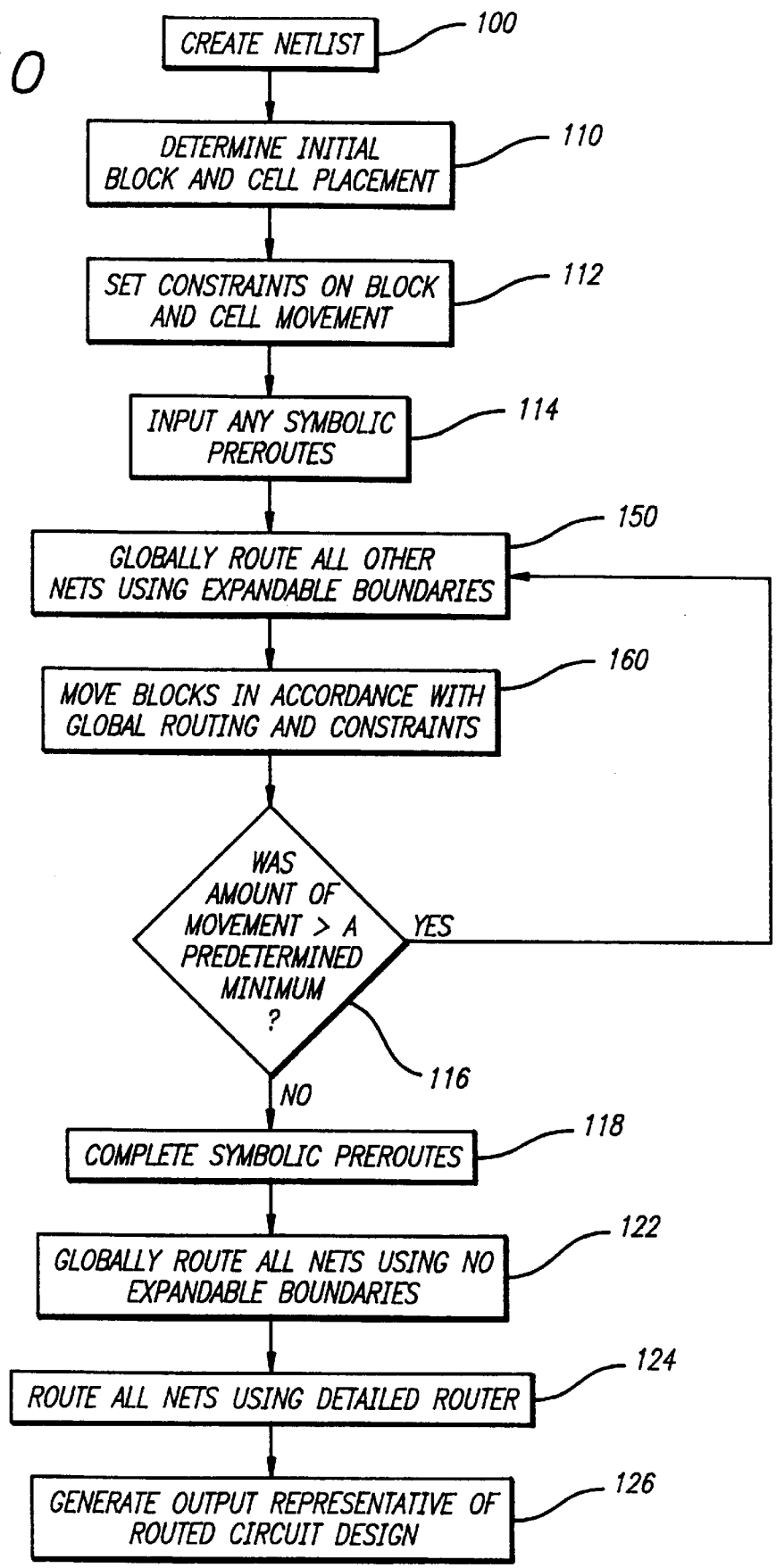
FIG. 10 is a flow chart describing the steps taken by the method of the invention to route cell-based designs.

The detailed description of the invention is now set forth with reference to FIGS. 10 and 11. The first step in the method of the invention is for the user to create a netlist which describes all of the interconnections among all of the circuit elements, standard cells, and/or cell blocks. The next step, represented by block 110, is to determine the initial block and cell placement. This step can be performed manually, or it may be performed by any number of commercially available block and cell placement routines.

At block 112, the invention permits the user to set any constraints on block and cell movement. This permits the user to align edges of blocks and maintain that alignment during the global routing process. Additionally, cell and block connectors can also be aligned and the alignment maintained. Minimum and maximum spacings between lines and/or cells and cell blocks can also be defined and maintained during the global routing process.

At block 114, the user can input any symbolic preroutes of interconnections such as power buses, clock signals, etc. which the user desires to be routed through particular spacings between the cells and/or blocks, or even through blocks. Further, preroutes may be defined to exist in a particular interconnect layer which the router may not have ordinarily chosen. The preroutes are accomplished by decomposing the interconnections into block-like structures which can be dealt with as if they are just small blocks.

At block 150, the global router logically routes all other nets in the netlist, making use of expandable boundaries. A more detailed description of the routine represented by block 150 will be presented later.

Once all of the nets have been successfully assigned to bin boundaries by the global router such that no overflows of capacity exist, the minimum required capacity on each expandable boundary is provided to the moving routine represented by block 160. The moving routine then moves the circuit elements, standard cells and/or blocks in accordance with the minimum capacities specified for the expandable boundaries, as well as any constraints input to the system during the routine represented by block 112. The moving routine also is constrained by the ground rules of the process in which the circuit is being manufactured. There are a number of known one and two dimensional compacting algorithms which can be used to implement the moving routine based on the inputs provided by the global router, initial constraints and process ground rules.

Decision block 116 determines whether the amount of movement of the circuit elements, cells and/or cell blocks is greater than a pre-determined minimum amount of movement. If yes, controls return to the global routing routine 150 and the process of globally routing all of the nets using expandable boundaries and the step of moving the blocks in accordance with the determinations made by the global router as well as user and process constraints is repeated until the amount of movement is less than the predetermined minimum (i.e. until a reasonable convergence is achieved).

When the amount of movement is less than the predetermined minimum, control is transferred to routine 118, during which the symbolic preroutes are completed. This entails making the actual connections of the prerouted interconnections to their appropriate connections as specified by the netlist.

The present invention then performs one final global routing of all of the nets, but does so with no expandable boundaries. This final global routing step provides a sanity check to ensure that all of the assignments made by the global router still make sense now that the circuit elements, standard cells and/or cell blocks are no longer permitted to move. At block 124, the method of the invention routes all of the nets using a detailed router. The detailed router can also be bin-based, but is usually performed with a much finer grid. The detailed router completes the actual interconnecting of all of the nets across the bin boundaries as assigned by the global router. Any number of known algorithms suitable for the detailed routing of gate arrays maya be used to implement the detailed routes of the invention.

At block 126, an output is generated which is representative of the various process levels of the routed circuit design. From this data output, masks may be generated for purposes of manufacturing the design circuit.

Figure 11:
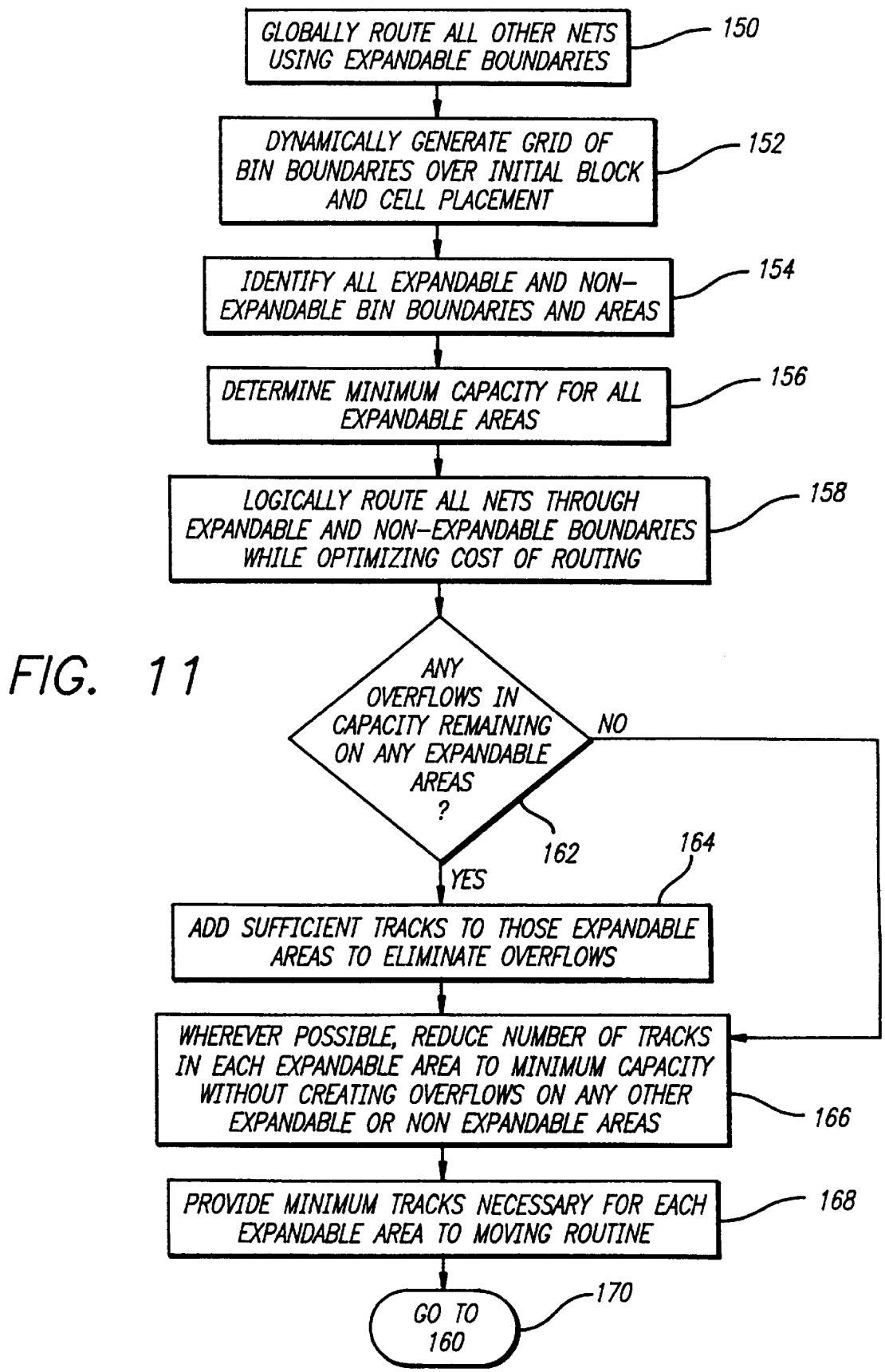
FIG. 11 is a flow chart describing the steps of the method of the invention to globally route all non-prerouted nets using expandable bin boundaries.

A more detailed description of the global routing routine 150 is now presented with reference to FIG. 11. At block 152, the present invention dynamically generates a coarse grid of bin boundaries over the initial block and cell placement. The grid is generated so as to maximize the number of expandable boundaries by running grid lines over channel spaces and over areas of cell blocks and standard cells which can be routed over using additional levels of interconnect.

In step 154 the invention identifies all expandable and non-expandable bin boundaries and expandable areas. In step 156 the invention determines the minimum capacity for all expandable boundaries and expandable areas. The minimum capacity of a given expandable area may be greater than zero in those cases where process constraints prevent the expandable area from being reduced below some particular width. In that case, there is no reason to continue to remove tracks from that expandable area if the moving routine cannot take advantage of the removal of those tracks.

The invention then attempts to logically route all of the nets through the expandable and non-expandable boundaries and areas while optimizing the cost of routing. A number of cost constraints can be placed on routing the various nets, including the total length of the interconnect line, the total number of turns in the line, etc. Further, costs may be placed on exceeding the capacity of non-expandable boundaries such that the global router is encouraged to remove interconnections from non-expandable boundaries having an overflow of capacity and re-routing those interconnections through expandable boundaries and expandable areas. Stated differently, the global router is thereby encouraged to transfer overflows of capacity from non-expandable to expandable areas and/or boundaries. This process continues until there are no longer any overflows in capacity on non-expandable boundaries.

At decision block 162, the invention determines whether any overflows in capacity exist on any expandable boundaries or expandable areas. If any such overflows exist, the global router adds a sufficient number of tracks to those expandable areas having overflows in order to eliminate the overflows in capacity. Once the overflows of capacity on expandable boundaries have been eliminated, the global router then attempts at each expandable boundary to remove each interconnect line (one-at-a-time) and attempts to re-route all of the tracks such that no overflows in capacity are created on any expandable or non-expandable boundaries. If such a re-routing can be successfully accomplished, the track is simply removed from the expandable boundary through which it originally was assigned to run. If the interconnect line cannot be removed from the expandable area without causing an overflow in some other expandable boundary or area, the interconnect line is left in its original position and the invention proceeds to the next interconnect line in the expandable area. This process proceeds for each expandable boundary or area until the invention has attempted to remove all of the interconnect lines within that expandable boundary. Of course, if a sufficient number of tracks can be removed from a particular expanded area and re-routing can be accomplished such that no new overflows are created at any other expandable or non-expandable areas, once the expandable area is reduced to its minimum capacity the invention moves on to the next expandable boundary or expandable area and attempts to reduce the number of tracks running through that expandable boundary or area in the same manner.

Once the invention has attempted to reduce all of the expandable boundaries and/or expandable areas to their respective minimum capacities, the global router provides the minimum required capacity for each non-expandable boundary or expandable area to the moving routine. Control is then returned to block 160 at which time the compaction routine takes over and attempts to move the blocks in accordance with the minimum capacity required for each expandable area as determined by the global router, as well as any constraints placed on the movement of blocks either by the user, or by ground rules for the process in which the circuit design is being manufactured.

What is claimed is:

1. A method of automatically routing interconnections among a plurality of circuit elements comprising a circuit, the circuit elements having one or more connectors, the interconnections defined by a netlist, the method comprising the steps of:

determining initial placement of the circuit elements;

globally routing all nets of the netlist losing expandable boundaries, wherein said expandable boundaries comprise expandable physical regions including bin boundaries coextensive with channel spaces through which nets may be routed;

moving the circuit elements in accordance with the results of said step of globally routing;

if the moving of the circuit elements by said step of moving is greater than a predetermined amount:
reputing said steps of globally routing and moving;
otherwise, globally routing all nets of the netlist using no expandable boundaries;

routing all nets of the netlist using a detailed router; and generating an output representative of the process layers for manufacturing the circuit.

2. The method of claim 1 further comprising the step of setting constraints on the movement of the circuit elements.

3. The method of claim 1 further comprising the step of prerouting one or more of the nets.

4. The method of claim 3, further comprising the step of setting constraints on the movement of the circuit elements.

5. A method of automatically routing interconnections among a plurality of elements on an integrated circuit comprising the steps of:

obtaining the initial element placement;

globally routing a plurality of said interconnections using expandable boundaries, wherein said expandable boundaries comprise expandable physical regions including bin boundaries coextensive with channel spaces through which nets may be routed;

moving said elements in accordance with the results of said step of globally routing;

repeating said steps of globally routing and moving until the movement of said elements pursuant to said step of moving is not greater than a predetermined amount; and globally routing a plurality of said interconnections using no expandable boundaries.

6. The method of claim 5, further comprising the step of using a detailed router to route said interconnections subsequent to the step of globally routing said interconnections using no expandable boundaries.

7. The method of claim 6, further comprising the step of generating an output representative of the process layers for manufacturing the circuit, said step performed subsequent to said step of using a detailed router.

8. The method of claim 5, wherein the step of moving moves said elements in accordance with the minimum capacities specified for the expandable boundaries.

9. The method of claim 8, wherein said step of moving further moves said elements in accordance with any constraints input by the user of said method, said constraints entered by said user prior to said step of moving.

10. The method of claim 5, further comprising the step of prerouting at least one interconnection prior to the step of globally routing using expandable boundaries, so that said prerouted interconnections are not re-routed during said step of global routing using expandable boundaries.

11. The method of claim 10, further comprising the step of prerouting at least one interconnection prior to the step of globally routing using no expandable boundaries, so that said prerouted interconnections are not re-routed during said step of global routing using no expandable boundaries.

12. The method of claim 5, wherein the step of obtaining the initial element placement comprises obtaining the initial element placement from a netlist generated by an element placement method.

13. The method of claim 5, further comprising, between the step of globally routing using expandable boundaries and the step of moving, the steps of:

generating a grid of bin boundaries over the element placement of the present iteration;

identifying all expandable bin boundaries and areas; and logically routing said interconnections through expandable and non-expandable boundaries while optimizing the cost of said routing.

14. The method of claim 13, further comprising between the step of logically routing said interconnections and the step of moving, the steps of:

adding sufficient tracks to said expandable areas on which overflows in capacity exist; and reducing the number of tracks in each expandable area to minimum capacity without creating overflows on any other expandable or non-expandable area.

15. The method of claim 14, further comprising between the step of reducing the number of tracks in each expandable area and the step of moving, the step of determining the minimum tracks necessary for each expandable area, said determination useable by said method during step of moving.

16. An apparatus for automatically routing interconnections among a plurality of elements on an integrated circuit, said apparatus comprising:

means for obtaining the initial element placement;

means for globally routing a plurality of said interconnections using expandable boundaries, wherein said expandable boundaries comprise expandable physical regions including bin boundaries coextensive with channel spaces through which nets may be routed;

means for moving said elements in accordance with the results of said step of globally routing;

means for repeating said global routing and moving until the movement of said elements during a single iteration of said moving is not greater than a predetermined amount; and means for globally routing a plurality of said interconnections using no expandable boundaries.

17. The apparatus of claim 16, further comprising:

means for generating a grid of bin boundaries over the element placement of the present iteration;

means for identifying all expandable bin boundaries and areas;

means for logically routing said interconnections through expandable and non-expandable boundaries while optimizing the cost of said routing;

means for adding sufficient tracks to said expandable areas on which overflows in capacity exist, thereby eliminating overflows;

means for reducing the number of tracks in each expandable area to minimum capacity without creating overflows on any other expandable or non-expandable area; and means for determining the minimum tracks necessary for each expandable area, said determination useable by said step of moving.

18. A computer program product comprising a computer-usable medium having computer-readable code embodied therein for automatically routing interconnections among a plurality of elements on an integrated circuit, the computer-readable code comprising:

an initial placement module, which is configured to obtain the initial element placement;

a first global routing module, which is configured to globally route a plurality of said interconnections using expandable boundaries, wherein said expandable boundaries comprise expandable physical regions including bin boundaries coextensive with channel spaces through which nets may be routed;

a movement module, which is configured to move said elements in accordance with the results from said first global routing module;

an iteration module, which is configured to repeat the procedures dictated by said first global routing module and said movement module until the involvement of said components during an iteration of said first global routing module and said movement module is not greater than a predetermined amount; and a second global routing module, which is configured to globally route a plurality of said interconnections using no expandable boundaries.

19. The computer program product of claim 18, further comprising:

a detailed router module, which is configured to route said interconnections subsequent to the global routing of said interconnections using no expandable boundaries; and an output generation module, which is configured to generate an output representative of the process layers for manufacturing the circuit.

20. The computer program product of claim 19, further comprising a prerouting module, which is configured to permit the prerouting at least one interconnection prior to the step of globally routing using expandable boundaries, so that said prerouted interconnections are not re-routed during the remainder of the routing process.

* * * * *